United States Patent [19]
Moore et al.

[11] Patent Number: 4,489,742
[45] Date of Patent: Dec. 25, 1984

[54] THERMOELECTRIC DEVICE AND METHOD OF MAKING AND USING SAME

[75] Inventors: Diane E. Moore, Clawson; Jaime M. Reyes, Birmingham; Eugen Munteanu, Pontiac, all of Mich.

[73] Assignee: Energy Conversion Devices, Inc., Troy, Mich.

[21] Appl. No.: 516,154

[22] Filed: Jul. 21, 1983

[51] Int. Cl.³ .......................................... H01L 35/28
[52] U.S. Cl. .................................... 136/203; 29/573; 62/3; 136/201; 136/205; 136/225; 136/238; 136/240
[58] Field of Search ............... 62/3; 29/573; 136/203, 136/205, 211, 238, 240, 225, 201

[56] References Cited
U.S. PATENT DOCUMENTS 3,296,033 1/1967 Scuro et al. .
3,851,381 12/1974 Alais et al. .
3,880,674 4/1975 Saunders ...................... 136/238 X
3,945,855 3/1976 Skrabek et al. .................. 136/240
4,036,665 7/1977 Barr et al. ......................... 136/202

FOREIGN PATENT DOCUMENTS 1282354 5/1970 United Kingdom .

Primary Examiner—Leland A. Sebastian
Attorney, Agent, or Firm—Richard M. Goldman

[57] ABSTRACT

An invention is disclosed which provides improved thermoelectric devices and methods of making and using the same. The device exhibits enhanced efficiency and operating life through the use of a bonding material comprising at least 75% busmuth together with an adherent metallic layer interposed between the boundary structure and correspondary thermoelectric semiconductor element.

38 Claims, 1 Drawing Figure

THERMOELECTRIC DEVICE AND METHOD OF MAKING AND USING SAME

BACKGROUND

The present invention relates to new and improved thermoelectric devices and to methods for manufacturing the same. In particular, this invention relates to such devices and methods in which the bonding structures between the individual thermoelectric elements and their adjacent conducting elements are optimized, resulting in compatibility of their properties. Characteristics of the thermoelectric elements, the conducting elements, and the bond structures therebetween are greatly improved. As a result, thermoelectric devices embodying this invention have enhanced operating efficiencies and longer operating lives.

Alternative energy sources are becoming increasingly important as our supply of fossil fuels diminishes. A partial solution to the problem of dwindling resources lies in energy conservation and full utilization of alternative resources. One way to more efficiently utilize our resources is to cut down on waste both by using our waste heat to generate electricity, and by more efficiently cooling and heating. Vehicles, power generation plants, and many industrial processes are inherently wasteful of heat by their very nature. Capturing and recycling some of this energy can avoid this waste. Thermoelectric devices can provide this generation of electricity from heat by direct conversion means, thereby decreasing waste and increasing efficiency. They also are capable of efficient cooling or heating by generating a thermal gradient from a d.c. current, via the Peltier effect.

The basic theory of thermoelectric effects was developed more than 100 years ago. The circuit for a simple thermoelectric device includes two dissimilar materials, for example, an n-type and a p-type thermoelectric semiconductor element and electrically conductive elements which are joined at opposite ends of the thermoelectric elements. In the most basic form, the thermoelectric elements are arranged in an alternating n-element:p-element configuration. They are joined alternatively top and bottom by the electrically conducting elements such that the electricity flows through the device. Each element then has two junctions with conducting elements at either end of the thermoelectric element, and these junctions are generally made with bonding structures. They may also be physically pressed together with a pressure contact system such as a spring, or other mechanical pressure configuration, however, these physical techniques have not been satisfactory from a contact resistance and integrity standpoint.

For power generation a temperature gradient is applied across the device. Heat may be applied to the hot side junction, at temperature $T_h$, from an external source, while the cold side ($T_c$) junction may be maintained at a lower temperature, usually by water cooling jackets or air circulation. As a result of the temperature difference, $T_h - T_c$, a current flows through the device in a series or parallel fashion depending on the circuit design. For cooling or heating, current is applied to the circuit and this current causes the pumping of heat from one side of the device to the other. Conversion from cooling to heating is achieved by reversing the direction of the current flow, whereby the junction that formerly was the cold side becomes the hot side.

The thermoelectric efficiency of a material or device is measured by the figure-of-merit (Z). It is dependent solely upon the properties of the materials, and is one indicia of the performance of a thermoelectric device. Z is defined as:

$$Z = \frac{S^2 \sigma}{K}$$

Where:
Z is expressed in units $\times 10^3/°K$.
S is the Seebeck coefficient in $\mu V/°C$.
K is the thermal conductivity in $mW/cm-°C$.
$\sigma$ is the electrical conductivity in $(\Omega cm)^{-1}$ As can be determined from the above equation, the highest value of Z occurs when the Seebeck coefficients(S) is high, the electrical conductivity ($\sigma$) is high, and the thermal conductivity (K) is low.

The maximization of $S^2\sigma$ occurs when its carrier concentration is in the range of $10^{19}$ to $10^{20}$ extrinsic charge carriers per cubic centimeter. For this reason, semiconductors have a larger figure-of-merit than either metals or insulators. To minimize the thermal conductivity (K) and consequently increase the figure-of-merit, one must minimize the main components of K: $K_l$, the lattice thermal conductivity, and $K_e$, the electronic thermal conductivity. The lattice thermal conductivity comes about from phonon transport through the thermoelectric material. This factor stays relatively constant throughout the full range of extrinsic charge carrier concentrations for a semiconductor. The electronic thermal conductivity comes from the movement of electrons through the material. As the material increases in number of charge carriers, and thus becomes more metal-like, the electronic thermal conductivity takes on a greater value and plays the major role in its contribution to the overall value of K. $K_l$ is the dominant factor for K in insulators and most semiconductors, while $K_e$ is the dominant factor for K in conductors.

In research on semiconductors for thermoelectric effects, it has been determined that no one material could provide a satisfactory figure-of-merit over a sufficiently wide temperature range to have broad thermoelectric utility over a wide temperature range. Consequently, much attention has been directed toward developing materials with a high figure-of-merit over relatively narrow temperature ranges. Most of the materials researched in semiconductors were binary and ternary compound tellurides and their solid solution alloys. Significant systems with regard to demonstrating thermoelectric device feasibility are solid solution alloys of bismuth telluride. On the basis of figure-of-merit alone, the Z values of bismuth telluride alloys above 250° C. are not high enough to be practical. On the other hand, germanium telluride, lead telluride and lead telluride-tin-telluride alloys exhibit high values of Z at temperatures as high as 700° C. However, the thermal instabilities of these materials due to evaporation of tellurium, limits their usefulness to temperatures not significantly above 500° C. Evaporation leads to a high resistance at the semiconductor-metal contacts and to a decrease in mechanical strength. This also leads to a need for encapsulization or the thermoelectric devices, so as to avoid sublimation of the tellurium. Nevertheless, for waste-heat situations which occur at hot-side temperatures between 100° C. and 300° C., the bismuth telluride alloys have a higher Z value and perform the best.

An example of bismuth telluride materials is discussed in co-pending U.S. patent application Ser. No. 412,306, filed Aug. 27, 1982, now U.S. Pat. No. 4,447,277, entitled "New Multiphase Thermoelectric Alloys And Method Of Making Same" by Tumkur Jayadev and On Van Nguyen, which is incorporated herein by reference.

Thermoelectric devices include one or more modules comprising a plurality of individual thermoelectric elements which are electrically connected to each other in series and/or parallel combinations to form complete modules. The application will determine whether a module is connected in a series or parallel combination. Such factors as required power output, voltage and current requirements, electrical resistance and thermal conductivity are considered. Each of the individual thermoelectric elements has two separate junctions with each of two electrically conductive elements which form a part of the overall circuit connection.

The junctions between the individual thermoelectric elements and the electrically conductive elements are usually formed by bonding the thermoelectric elements to the electrically conductive elements with a bonding structure. The overall characteristics and properties of the thermoelectric device can be greatly affected by the compatibility of the bonding structure with the individual thermoelectric elements and with the electrically conductive elements. The greatest problems with incompatibility between the bonding structure and the individual thermoelectric elements and/or the electrically conductive elements arise from diffusion of components into and out of the thermoelectric element and/or the conductive element. This diffusion may result in degradation of any or all of the elements in the bonding structures. Other compatability problems arise, for example, from mismatching of bonding structure melting temperature and device operating temperature; and mismatching of thermal expansion coefficients, which will ultimately cause the bonds to break due to thermal stress. Thermal stress occurs when one component expands to a different degree than an adjacent one upon heating thereby straining the bonding structure.

It is imperative that all components of a thermoelectric device have satisfactory electrical conductivity. If the electrical resistance of the bond structure is high, an undesirably high voltage drop and energy loss results. High electrical conductivity of all components, including the bonding structure, is important to minimize this effect. Otherwise, the cumulative effect of the resistance of the bonding structures may reduce the performance of the device to an unacceptable level.

In addition to high electrical conductivity, the bonding structure must also exhibit high thermal conductivity to achieve a desirable performance. Operation of a thermoelectric device depends on maintaining a temperature gradient across the thermoelectric elements; therefore the thermal conductivity of the bond structure must be high to insure maximum temperature gradient across the semiconductor elements. Consequently, a bonding structure must have a high thermal conductivity to be compatible and enhance overall performance of a device.

It has been found in some applications that the performance and operating life of a thermoelectric device can be seriously limited by diffusion of materials from, to, and through the bond structure if the materials poison the thermoelectric elements or cause deterioration or breaking of the bond structures. The bond structures therefore forms an integral and important part of the overall thermoelectric device structure and has significant impact not only on device performance, but on the operating life of the device as well. An example of the diffusion problem arises when a conventional lead-tin bonding structure is used to bond nickel-plated electrically conductive copper straps to bismuth/antimony telluride pressed powder thermoelectric elements. The tin from the lead-tin bonding structure diffuses into the bismuth telluride thermoelectric element across the interface. Simultaneously, antimony diffuses out of the element into the bonding structure and turns the bond into a powdery substance which ultimately results in a failure of the bond and consequent loss of necessary electrical continuity. This problem occurs to a greater extent at the hot side junction simply due to its higher temperature which accelerates the diffusion rate. As a result, any bonding structure containing tin has been incompatible with the bismuth telluride system. It would be desirable to have a compatible bonding structure which could satisfy the thermoelectric and adhesion requirements above without creating serious diffusion problems.

SUMMARY OF THE INVENTION

The present invention provides an improved thermoelectric component for generating electricity and for effecting thermoelectric cooling and heating via the Peltier effect. The thermoelectric component includes a thermoelectric semiconductor element and a bonding structure comprising at least 85 weight percent bismuth. This bonding structure is in electrical and thermal contact with the thermoelectric semiconductor element and is bonded thereto. Normally, an electrically conductive element is bonded to the thermoelectric element by the bonding structure, placing the conductive element and the thermoelectric element in electrical and thermal contact. Interposed between the bonding structure and one or more of the elements is a layer of metal comprising nickel, copper or iron.

Thermoelectric devices are typically made using n- and p-type thermoelectric elements connected electrically in series and thermally in parallel. Their connection is achieved with a plurality of electrically conductive elements bonded to the thermoelectric elements with bonding structures comprising at least 85 weight percent bismuth with suitable metallic layers interposed between elements and bond structures. In one embodiment, the device includes bismuth telluride thermoelectric elements bonded to copper conducting elements. The bonding is achieved with a bonding structure comprising at least 75 weight percent bismuth, together with minor amounts of antimony and copper. A nickel layer is interposed between the elements and bond structure.

The abovementioned thermoelectric component is manufactured by contacting a bonding structure with a thermoelectric semiconductor element and melting the bonding structure to effect adhesion. To manufacture a thermoelectric device made of more than one thermoelectric component, electrically conductive elements are bonded to thermoelectric elements by melting the bonding structure provided between respective pairs of electrically conductive elements and thermoelectric elements.

To generate electricity from a thermal gradient, the device is subjected to a temperature gradient across the thermoelectric elements and the conductive elements are connected to complete the electrical circuit. To generate a thermal gradient, as required for thermoelectric cooling or heating, the device is subjected to a flow of electric current. A temperature gradient is created along the direction of the current flow through the thermoelectric elements due to the Peltier effect and this functions to cool at the cold junction and heat at the hot junction.

DETAILED DESCRIPTION OF THE INVENTION

Figure 1:
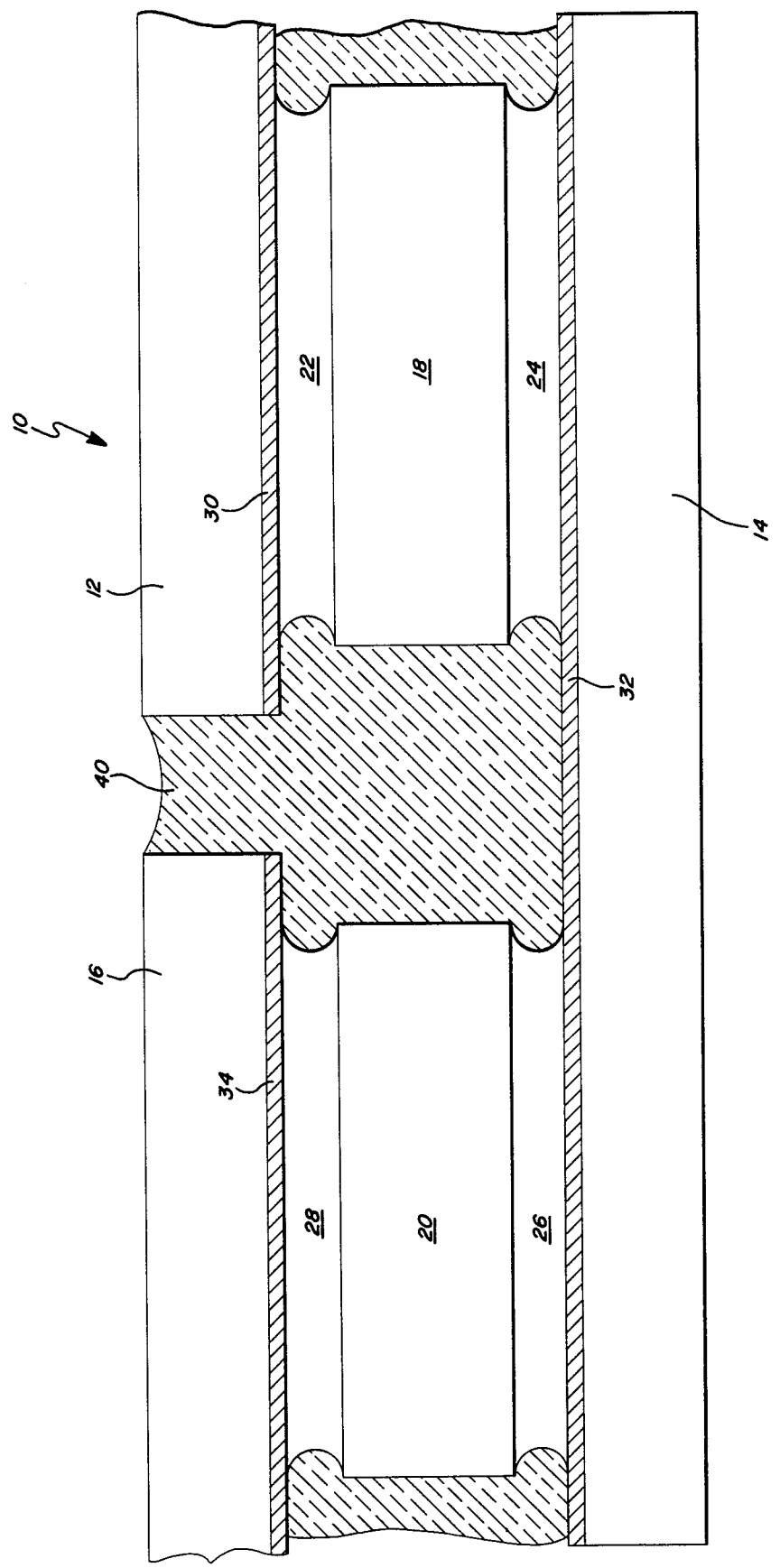
FIG. 1 is a cross-sectional view of a thermoelectric device embodying the present invention.

In accordance with the present invention, the new and improved thermoelectric device and process for manufacture thereof shall now be described.

FIG. 1, illustrates a thermoelectric device in accordance with the present invention. The device 10 includes a plurality of electrically conductive elements 12, 14 and 16 bonded to n-type and p-type thermoelectric elements 18 and 20 respectively by means of bonding structures 22, 24, 26 and 28 bonded between them. Interposed between the bonding structures and conductive elements are metallic layers 30, 32 and 34 which improve adhesion. The n-type and p-type thermoelectric elements 18 and 20 are typically connected electrically in series and thermally in parallel. The device 10 may be bonded so as to form a series, parallel or mixed series-parallel device. The bonding structure 22, 24, 26 or 28 is comprised of at least 75 preferably at least 85 weight percent bismuth. A representative composition of the p-type element is from about 10 to 20 atomic percent bismuth, about 20 to 30% antimony, about 60% tellurium and less than 1% silver. The n-type material elements may comprise, for example, about 40% bismuth, about 48% tellurium and about 12% selenium. These materials and others usable as p-type and n-type elements are disclosed in copending U.S. Ser. No. 412,306 filed Aug. 27, 1982, now U.S. Pat. No. 4,447,277, for NEW MULTIPHASE THERMOELECTRIC ALLOYS AND METHOD FOR MAKING SAME and copending U.S. Ser. No. 414,917 filed Sept. 3, 1982, for NEW POWDER PRESSED THERMOELECTRIC MATERIAL AND METHOD OF MAKING SAME which applications are incorporated herein by reference.

These alloy materials are powder pressed materials and may be pressed into any desired size and shape. The devices of the present invention generally use elements about 1-4 millimeters in each dimension. The size and shape of the elements are determined by the application of the device.

An adherent layer containing nickel, iron, or copper (30, 32, 34) or their alloys is affixed either to the conductive elements (as shown in the drawing) or to the thermoelectric elements or both. This metallic layer improves the adhesion of the bonding structure to the element. To further limit diffusion, a barrier layer may be employed at any interface. The adherent and barrier layer may be applied by any suitable technique such as screenprinting, cladding, evaporating, vacuum deposition, chemical or electroless plating, electroplating, dipping or powder pressing.

Referring again to FIG. 1, the n-type and p-type thermoelectric elements are electrically interconnected by a plurality of electrically conductive elements 12, 14 and 16. These electrically conductive elements generally comprise copper, zinc, aluminum, nickel or iron. They may be made of pure metals or alloys with other metals.

The bonding structures are comprised of at least 85 weight percent bismuth. The bonding structure may additionally comprise at least one metallic element from the groups IB, IIA, IIB, IIIB, VB, VIB, and VIIIA of the Periodic Table (IUPAC). The structures are generally either binary or ternary compounds. Preferably, bismuth is combined with antimony or silver and small amounts of a conductivity-enhancing element, such as copper or aluminum, may be added if desired. The addition of antimony raises the melting point of the bonding structure, to make its use feasible in higher temperature operating devices. A further element may be selected to aid wettability, enhance conductivity, or to change the properties of the bonding structure to be more compatible with the device and its desired use.

The bonding structures employed in the device are chosen for their ability to reduce diffusion of contaminants to, from, and through the bonding structures. Other criteria which must be met in their selection are (1) their ability to wet the thermoelectric materials at the operating temperature of the device; (2) their melting point, and (3) their ability to insure good electrical contact between the thermoelectric elements and the electrically conductive elements. The bonding structures may comprise for example the following (percents by weight): 100% bismuth; 85% bismuth, 15% antimony; 85% bismuth, 14% antimony, 1% copper; 85% bismuth, 14% antimony, 1% aluminum; 95.5% bismuth, 4.5% silver. The most notable contaminant which must be avoided is tin. Another contaminant which must be avoided is lead. Using conventional lead-tin bonding structures results in the diffusion of tin into the thermoelectric elements, and antimony diffuses out of the thermoelectric elements. This elemental exchange yields devices which physically deteriorate because the cross diffusion makes the bonding structure turn into a powdery substance.

A casting compound 40 such as an epoxy or a ceramic potting compound may be used to fill the voids between elements. For example, Aremco 554, a polymide plastic ceramic is suitable. The casting compound has qualities of high electrical and thermal resistivity to insulate the elements and also serves to protect the elements from contamination and acts to strengthen the device upon thermal expansion of the device in use, thereby improving the structural integrity of the device. This casting compound acts to maximize the temperature differential across the thermoelectric elements for a given temperature differential across the device.

The thermoelectric device may further comprise a singular continuous substrate bonded to the outer surface of the electrically conductive elements opposite that surface which is bonded to the thermoelectric elements. The device may also have a second continuous substrate bonded to the outer surface of the electrically conductive elements on the side of the device opposite the first continuous substrate. These continuous substrates add structural integrity and give support for manufacture of the device and are advantageoulsy composed of materials of high electrical resistance and low thermal resistance. The device may also be a substrateless device, for example, as described in copending U.S. Ser. No. 482,826 filed Apr. 7, 1983, now U.S. Pat. No. 4,465,894, by Jaime M. Reyes for IMPROVED SUBSTRATELESS THERMOELECTRIC DEVICE AND METHOD FOR MAKING SAME, which application is incorporated herein by reference.

Devices of the invention may be manufactured by first forming the adherent metallic layer on the elements (thermoelectric, conductive or both) and then contacting the bonding materials, simultaneously or at different points in the manufacturing cycle, with the thermoelectric and conductive elements at temperatures high enough to melt the solder but not high enough to melt the other device components. An adherent bonding structure is thereby formed between the thermoelectric and conductive elements.

Desirably, a flux is used to improve adhesion between the element and bonding material. The flux is applied to the surface before or during melting of the bonding material. Suitable fluxes include those containing rosin, activated rosin or stearic acid. Examples are (1) mildly activated rosin, (2) stearic acid with solvent, (3) stearic acid with petroleum jelly, (4) rosin with stearic acid, (5) rosin with ammonium acetate, and (6) rosin with acetic acid. While flux may not be necessary if extreme care is taken to avoid impurities, soils and oxidation, flux is a practical necessity under normal manufacturing conditions.

Depending on materials and conditions, it may be desirable to provide a diffusion barrier layer to further inhibit diffusion of components. The barrier may be interposed between the bonding structure and the conductive or thermoelectric elements or both.

The method of applying the adherent metal layer, the bonding structure and barrier layer be by any means which provides necessary adhesion such as screen printing, cladding, evaporating, vacuum depositing, chemical or electroless plating, electroplating, dipping, spraying or powder pressing. The bonding material may be applied by pre-tinning (paste) or as preforms (foil).

The bonding material may be applied as a melt or applied and then reflowed to form the bonding structures. Reflowing may be accomplished in any conventional manner such as heat-pressing, hot surface, exposure, convection heating (furnace/oven) and molecular excitation. The elements may be either sequentially or simultaneously adhered to the bonding structure.

Application of the casting compound may be accomplished by injection or any other conventional techniques.

Annealing the assembled device at moderate temperatures in the range of anticipated operating conditions, e.g. at about 250° for at least two and preferably three days has been found advantagious. The annealing is conducted in the absence of oxygen (e.g. under vacuum, argon, nitrogen, hydrogen or helium).

The device may be strengthened by bonding a continuous substrate to the conductive elements on one or both exterior surfaces of the device. The device may be adapted for use on a surface of particular configuration and, in particular, may be lapped flat for planar applications.

By orienting the device properly relative to the actual or desired thermal gradient and by providing electrical connections placing the device in series with a load or power source, energy conversion may be effected. When oriented so that the thermoelectric elements are all parallel to each other and to the direction of a thermal gradient, electricity will be supplied to a load or source in the circuit so long as the temperature gradient is maintained.

In a similar manner, if a current is applied to the device, it will generate a thermal gradient via the Peltier effect. Proper orientation of the device and current direction will result in either heating or cooling as desired.

Examples of thermoelectric devices made in accordance with the present invention are set forth below:

EXAMPLE 1

A thermoelectric device was prepared by employing nickel-plated bismuth-telluride sintered thermoelectric elements and nickel-plated pure copper electrically conductive elements upon which bismuth-antimony solder (95wt.% Bi; 5% Sb) had been evaporated to a uniform thickness of about 0.002 inches. Mildly activated rosin flux was applied to the bonding structure joints and the device was assembled by heat-pressing the components together at 325° C. until the bonding structure melted. Pressure was applied during the heating step to assure a more uniform bond which has fewer voids and fewer pockets of flux. After the heating step, an epoxy-based casting compound was flowed into the cavities between the thermoelectric elements and allowed to cure. The entire device was then annealed at 250° C. for 100 hours to allow components to attain an equilibrium state. The resulting device exhibited a greatly improved efficiency and a much longer operating life due to the lack of contaminating agents and increased compatibility of all components. Compared to a similar devie with conventional bonding materials, the casting compound adds greatly to the integrity of the device.

EXAMPLE 2

A bonding structure composed of 85 weight percent bismuth, 14 weight percent antimony and 1 weight percent copper was utilized with nickel-plated bismuth-telluride thermoelectric elements in conjunction with nickel-clad copper electrically conductive elements. The bonding structure was applied by hand using mildly activated rosin as the flux. In order to reflow the bonding structure, a controlled temperature hot surface was used. After life testing for 1000 hours at 250° C. in a nitrogen atomosphere, the device efficiency had not measurably dropped. This improved life test behavior may be explained in part by the use of the bismuth-antimony-copper solder. It reduces diffusion of contaminants through the device and extends its operating life. When similar tests were conducted using conductive elements without nickel plating, the devices lost continuity due to adhesion failure.

EXAMPLE 3

The procedures of Example 1 were repeated except that the bismuth-antimony bonding structure was powder pressed into the thermoelectric elements during the assembly rather than evaporated onto their surface. This was accomplished by pressing a thin layer of bismuth-antimony powder onto the sintered bismuth-telluride thermoelectric elements. Thereafter flux was applied with a standard liquid technique prior to effecting adhesion to the conductive elements. The flux used in this instance was a solution of rosin with stearic acid. This flux cleans the surfaces to be bonded, breaks down the oxide layer, and protects the new surfaces from further oxidation. Bonds made using the flux were strongly adherent whereas those without the flux, exhibited little or no adhesion.

EXAMPLE 4

A thermoelectric device was prepared as described in Example 3, however, a solution of stearic acid with petroleum jelly was used as the flux. This substitution provides substantially the same performance as indicated in Example 3.

EXAMPLE 5

A thermoelectric device was prepared similar to that of Example 2, but the nickel-plated copper conductive elements were replaced with iron-plated copper conductive elements. The device demonstrated an efficiency and performance comparable to the nickel-plated conductive elements. Iron was plated onto the copper conductive elements prior to assembly and was used in the same manner as the conductive element in Example 2. When the device was subjected to life testing at a temperature of 250° C. under nitrogen for 1000 hours, no noticable deterioration of physical integrity or electrical conductivity was observed.

The foregoing examples are to be considered as merely illustrative of the present invention and not as restrictive thereof. Variations and specific materials and techniques may be used by those skilled in the art in light of the present disclosure, which are to be considered within the scope of the present invention.

What is claimed is:

1. A thermoelectric unit, comprising
   (a.) a thermoelectric semiconductor element;
   (b.) at least one electrically conductive element;
   (c.) a thermally and electrically conductive bonding structure disposed between and bonded to said thermoelectric element and to said electrically conductive element whereby the conducting element and thermoelectric element are in electrical and thermal contact, said bonding structure comprising at least 75 weight percent bismuth; and
   (d.) a layer comprising at least one metal selected from the group consisting of nickel, copper and iron adhered to and interposed between said bonding structure and at least one of said elements.

2. A thermoelectric unit, as defined in claim 1, wherein said bonding structure additionally comprises at least one metallic element selected from the groups IB, IIA, IIB, IIIB, VB, VIB and VIIIA of the Periodic Table (IUPAC).

3. A thermoelectric unit, as defined in claim 1, wherein said bonding structure additionally comprises at least one element selected from the group consisting of antimony, copper, aluminum and silver.

4. A thermoelectric unit, as defined in claim 1, wherein said thermoelectric element contains bismuth and tellurium.

5. A thermoelectric unit, as defined in claim 1, wherein said thermoelectric element contains lead and tellurium.

6. A thermoelectric unit as defined in claim 1, wherein said electrically conductive elements are formed from at least one metal selected from the group consisting of copper, zinc, aluminum, nickel and iron.

7. A thermoelectric device, comprising:
   (a.) an n-type thermoelectric element;
   (b.) a p-type thermoelectric element connected electrically in series and thermally in parallel with said n-type thermoelectric element;
   (c.) a plurality of electrically conductive elements in thermal and electrical contact with opposite sides of each of said thermoelectric elements to form said series and parallel connections;
   (d.) bonding structures bonded between said electrically conductive elements and said thermoelectric elements, said bonding structures comprising at least 75 weight percent bismuth, and
   (e.) a layer comprising at least one metal selected from the group consisting of nickel, copper and iron adhered to and interposed between said bonding structure and said elements.

8. A thermoelectric device as defined in claim 7, wherein said bonding structure additionally comprises at least one element selected from the groups IB, IIA, IIB, IIIB, VB, VIB and VIIIA of the Periodic Table.

9. A thermoelectric device, as defined in claim 8, wherein said additional element comprises at least one metal selected from the group consisting of antimony, copper, aluminum and silver.

10. A thermoelectric device, as defined in claim 7, wherein said thermoelectric element contains bismuth and tellurium.

11. A thermoelectric device, as defined in claim 7, wherein said thermoelectric element contains lead and tellurium.

12. A thermoelectric device, as defined in claim 7, comprising a plurality of n- and p-type elements and wherein said n- and p-type elements are arranged in an alternating manner and conductively interconnected to form a series current path.

13. A thermoelectric device, as defined in claim 7, comprising a plurality of n- and p-type elements and wherein said n- and p-type elements are arranged in an alternating manner and conductively interconnected to form a parallel current path.

14. A thermoelectric device as defined in claim 7, comprising a plurality of n- and p-type elements and wherein said n- and p-type elements are arranged in an alternating manner and conductively interconnected to form a mixed series-parallel current path.

15. A thermoelectric device as defined in claim 7, further comprising a first continuous substrate bonded to said electrically conductive elements on the outer surface opposite to the thermoelectric elements, whereby the integrity of the device is improved.

16. A thermoelectric device as defined in claim 15, further comprising a second continuous substrate bonded to the outer surface of said electrically conductive elements on the opposite side of said thermoelectric device from the first continuous substrate.

17. A thermoelectric device as defined in claim 7, further comprising a casting compound substantially filling the space between said thermoelectric elements.

18. A thermoelectric device as defined in claim 17, wherein said casting compound is selected from the group consisting of epoxies and ceramic cement compounds.

19. A process useful in the manufacture of the thermoelectric unit of claim 1, comprising the steps of
   (a) forming a layer comprising at least one metal selected from the group consisting of nickel, copper and iron on at least one of said elements and
   (b) contacting a bonding material comprising at least 85 weight percent bismuth with said thermoelectric semiconductor element and to said electrically conductive element at a temperature sufficient to melt the bonding material whereby an adherent bonding structure is formed.

20. The process of claim 19, further comprising the step of contacting a flux comprising rosin, activated rosin or stearic acid, with one of said elements before contacting with said bonding material.

21. The process of claim 19, wherein said metal layer is formed by cladding the metal onto the element.

22. The process of claim 19, wherein said metal layer is formed by plating the metal onto the element.

23. The process of claim 22, wherein said metal layer is formed by electroless plating the metal onto the element.

24. The process of claim 22, wherein said metal layer is formed by electroplating the metal onto the element.

25. The process of claim 19, comprising not pressing the bonding material with the thermoelectric semiconductor element and the electrically conductive element to melt the bonding material.

26. The process of claim 19 comprising applying the bonding structure by evaporation.

27. The process of claim 19 comprising applying the bonding structure by powder pressing.

28. The process of claim 19, comprising the step of simultaneously contacting each of said bonding materials to the respective semiconductor element and electrically conductive element at a temperature sufficient to melt each said bonding material and form adherent bonding structures.

29. The process of claim 19, comprising the step of substantially filling the space between said thermoelectric elements with casting compound.

30. The process of claim 19, further comprising the step of lapping the assembled device flat.

31. The process of claim 19, further comprising the step of annealing the assembled device for a time and at a temperature sufficient to accelerate the attainment of an equilibirium state said temperature being suffiently low to substantially avoid sublimation or melting of said thermoelectric elements, said bonding structure or said conducting elements.

32. A process as described in claim 31, wherein said step of annealing comprises heating said device for at least two days at about 250° C. and allowing said device to slowly cool to room temperature under ambient conditions.

33. A process as described in claim 31, wherein said step of annealing comprises heating said device in an atmosphere of gas selected from the group consisting of argon, nitrogen, hydrogen and helium.

34. A method for generating electricity comprising subjecting the thermoelectric device of claim 7 to a temperature gradient and connecting the respective conductive elements to complete an electrical circuit.

35. A method for generating electricity from a thermal gradient, comprising:
(a) orienting the device of claim 7 so that the direction of the thermal gradient is parallel to the desired direction of current flow through the thermoelectric elements;
(b) maintaining said thermal gradient;
(c) completing an electric circuit whereby an electrical current is generated.

36. A method of generating a thermal gradient comprising subjecting the thermoelectric device of claim 7 to the flow of an electric current, thereby creating a temperature gradient due to the Peltier effect along the direction of current flow in the thermoelectric element.

37. A method of effecting refrigeration comprising thermally connecting the cold junction of the thermoelectric device of claim 7 to an object to be refrigerated, thermally connecting the hot junction to a heat sink, and applying a direct current through the semiconductor elements of the device in a direction parallel to the temperature gradient in a direction so as to maintain the desired thermal gradient.

38. A method of effecting thermoelectric heating comprising connecting the hot junction of the thermoelectric device of claim 7 to an object to be heated, connecting the cold junction to a heat sink and applying a direct current through the semiconductor elements of the device in a direction parallel to the temperature gradient in direction so as to maintain the desired thermal gradient.

* * * * *